United States Patent [19]

Abbiate et al.

[11] Patent Number: 5,329,553
[45] Date of Patent: Jul. 12, 1994

[54] DECIMATION FILTER FOR A SIGMA-DELTA CONVERTER AND DATA CIRCUIT TERMINATING EQUIPMENT INCLUDING THE SAME

[75] Inventors: Jean-Claude Abbiate, La Gaude; Alain Blanc, Vence; Patrick Jeanniot, La Gaude; Gerard Richter, Nice, all of France

[73] Assignee: International Business Machines Corporation, Armonk, N.Y.

[21] Appl. No.: 878,128

[22] Filed: May 4, 1992

[30] Foreign Application Priority Data

Jul. 17, 1991 [EP] European Pat. Off. ........ 91480115.4

[51] Int. Cl.⁵ .................. H04B 14/06; H04L 7/06
[52] U.S. Cl. ................................. 375/28; 375/113;
    364/724.04; 364/724.1; 341/143
[58] Field of Search .......... 375/25, 28, 103, 111–113;
    364/724.04, 724.1; 341/143; 333/173

[56] References Cited

U.S. PATENT DOCUMENTS

| | | | |
|---|---|---|---|
| 4,937,577 | 6/1990 | Rich et al. | 364/724.1 |
| 5,055,843 | 10/1991 | Ferguson, Jr. et al. | 375/28 |
| 5,157,395 | 10/1992 | Del Signore et al. | 364/724.1 |
| 5,191,547 | 3/1993 | Kawamoto et al. | 364/724.1 |

FOREIGN PATENT DOCUMENTS

| | | | |
|---|---|---|---|
| 0329381 | 8/1989 | European Pat. Off. | H03H 17/06 |
| 0356598 | 3/1990 | European Pat. Off. | H03H 17/06 |
| 9013942 | 11/1990 | World Int. Prop. O. | 364/724.1 |

OTHER PUBLICATIONS

"PCM codec with One-Chip Digital Filters" by L. Van De Meeberg and T. G. Janssen, IEEE, 1980.

*Primary Examiner*—Stephen Chin
*Assistant Examiner*—Young Tse
*Attorney, Agent, or Firm*—Edward H. Duffield; John J. Timar

[57] ABSTRACT

A decimation filter for converting a received train of sigma-delta pulses in synchronism with a sigma-delta clock (fs) into a train of Pulse Code Modulation (PCM) samples having a PCM clock in accordance with the formula $$H(f) = \left( \frac{\sin\left(\frac{N\pi f}{fs}\right)}{N\sin\left(\frac{\pi f}{fs}\right)} \right)^P$$

includes a computer for computing one PCM sample from a sequence of sigma-delta samples in synchronism with the PCM clock and also a comparison circuit for determining whether phase correction of the PCM clock is necessary to lock the generation of the PCM samples on the sigma-delta clock extracted from the received sigma-delta signal, the decimation filter including shifters which shift the computation process at least one sigma-delta clock pulse in order to provide phase control in the generation of the PCM samples.

7 Claims, 12 Drawing Sheets

FIG. 3

| Fb \ Fs | 10K | 50K | 100K | 200K | 500K | 1M | 2M | 5M | 10M |
|---|---|---|---|---|---|---|---|---|---|
| 100HZ | 72 | 104 | | | | | | | |
| 200HZ | 59 | 90 | 104 | | | | | | |
| 500HZ | 37 | 72 | 85 | 100 | | | | | |
| 1K | 22 | 57 | 72 | 85 | 104 | | | | |
| 3K | | 35 | 50 | 64 | 83 | 88 | 109 | | |
| 10K | | | 22 | 37 | 59 | 72 | 85 | 104 | |
| 20K | | | | 22 | 40 | 59 | 72 | 90 | 104 |
| 40K | | | | | 24 | 40 | 58 | 75 | 89 |
| 72K | | | | | | 30 | 45 | 65 | 78 |
| 100K | | | | | | 22 | 37 | 59 | 72 |

DECIMATION FILTER FOR A SIGMA-DELTA CONVERTER AND DATA CIRCUIT TERMINATING EQUIPMENT INCLUDING THE SAME

TECHNICAL FIELD

The present invention relates to digital decimation and filtering devices and more particularly to a decimation filter for converting a train of sigma-delta pulses into a corresponding train of Pulse Code Modulation samples.

BACKGROUND ART

Phase locked oscillators are well known in the data communication field. They are particularly used for recovering the clock existing in a train of data received on a telecommunication line and also for determining the more appropriate instants when the received signal has to be sampled in order to recover the transmitted bits. FIG. 1A shows an illustrative example of an equalized bipolar analog signal 101 with a bit period 104 which is likely to be processed by the receiving part of a modem. The modem samples the received analog signal at different instants determined by a sampling clock. In the figure, two distinctive sets of sampling instants are illustrated: a first set 103a, 103b, 103c . . . which corresponds to a sampling clock which is not locked on the receive clock carried by the signal and, conversely, a second set 102a, 102b, 102c . . . which corresponds to a sampling clock that is actually locked on the receive clock and would assure the best efficiency for the data recovery process.

Moreover, sigma-delta technology is of great interest for realizing linear, accurate and simple analog-to-digital converters which can be used in Data Circuit Terminating Equipment (DCE) or modems. Sigma-delta coders and decoders generally require the use of decimation circuits requiring a great number of electronic components. For that reason, decimation circuits are embodied by means of Very Large Scale Technology (VLSI) components.

FIG. 1B shows the traditional basic structure of an analog-to-digital converter using a sigma-delta converter 130 for converting an analog input signal existing on lead 110 to a train of sigma-delta pulses on a lead 120. The train of sigma-delta pulses comprises a high level of out-of-band quantization noise which is then entered into a decimation circuit 170 in order to convert the sigma-delta pulses into a sequence of Pulse Code Modulation (PCM) samples on leads 140. For that purpose, decimation circuit 170 includes a low-pass digital filter 150 for suppressing the above out-of-band quantization noise and for avoiding in-band aliasing during the decimation process. Decimation circuit 170 also includes a specific decimation element 160 which samples down the output signal of low-pass filter 150. This is simply achieved by taking one sample over N samples. N is called the decimation factor of the decimation process.

FIG. 2 illustrates the different signal spectra which are involved in the sigma-delta conversion and decimation processes. FIG. 2A shows a spectrum of a typical band-limited analog input signal which is carried by lead 110. FIG. 2B shows the spectrum of the corresponding train of sigma-delta pulses existing on lead 120 that result from the sigma-delta conversion process. As mentioned above, the sigma-delta bit stream of FIG. 2B has a high level of out-of-band quantization noise which periodically extends over the whole band with a period fs which is equal to the value of the sigma-delta modulation frequency. The dotted lines in FIG. 2c illustrate the frequency response of low-pass filter 150 and the resulting filtered signal which has a spectrum which is shown in FIG. 2D. FIG. 2E illustrates the spectrum of the PCM signal which exists at the output of decimation circuit 170. The PCM words are generated at a frequency of fs/N.

Since sigma-delta technology is particularly well-suited for modems, a need has appeared for a simple and efficient decimation filter associated with a sigma-delta converter which allows phase control of the PCM sample generation.

OBJECT OF INVENTION

An object of the present invention is to provide a decimation filter by which it is possible to control the phase of PCM samples that correspond to a train of sigma-delta pulses.

BRIEF SUMMARY OF INVENTION

A decimation filter according to the present invention converts a train of sigma-delta pulses in synchronism with a sigma-delta clock (fs) into a train of Pulse Code Modulation (PCM) samples in accordance with the formula $$H(f) = \left( \frac{\sin\left(\frac{N\pi f}{fs}\right)}{N \sin\left(\frac{\pi f}{fs}\right)} \right)^p$$

and comprises means for computing one PCM sample from a sequence of L sigma-delta samples in synchronism with a PCM clock. According to the present invention, the decimation filter includes means for shifting the computation process one sequence of at least one sigma-delta clock period whereby the generation of the computed PCM pulse can be phase-controlled with respect to the receive clock existing in the analog signal.

In a preferred embodiment, the value of p is equal to 3 and the filter includes at least one computing means ( 350, 360, 370 ) for computing one PCM sample from a sequence of $3 \times N$ input samples according to the formula:

$$\sum_{n=0}^{3N-1} C_n S_{i+n}$$

where C(n) is the sequence of the coefficients of the decimation filter corresponding to a determined decimation factor N. The filter further includes means for generating the sequence C(n) corresponding to a determined decimation factor N, and multiplying means for multiplying each coefficient Cn of said sequence C(n) by a sigma-delta input sample S(i+n). The filter detects the occurrence of the coefficient $C(3 \times N - 1)$ which is equal to zero and includes means responsive to the detection of said coefficient $C(3 \times N - 1)$ equaling zero for shifting the initiating of the computing process of the next PCM pulse by one sigma-delta clock pulse. A phase-controlled decimation filter is provided which requires a simple test on the value of the coefficient Cn in order to synchronize the operation of each computing means (350, 360, 370) on the phase controlled PCM clock.

More preferably, the filter includes three computing means receiving the sigma-delta clock (fs) and which compute one PCM sample from a sequence of $3 \times N$ consecutive input sigma-delta pulses. Each computing means includes counting means which has a reset and a control lead for performing either an incrementation by one or a decrementation by two according to the state of said control lead, a first register for storing the value of the coefficient C(n) to be multiplied by a corresponding sigma-delta input sample S(i+n), and adding means (327, 337, 347) active every sigma-delta clock period for adding the contents of said counting means with the contents of said first register in order to compute the following coefficient to be loaded into said first register. The filter further includes means for respectively generating control and reset signals in order to provide in said computing means the generation of the sequence of coefficients C(n) corresponding to said determined decimation factor N. The advantage result in that the sequence of coefficients is automatically generated whatever the value of the decimation factor is and that the same physical chip can be used for a wide variety of modems.

BRIEF DESCRIPTION OF THE DRAWINGS

FIG. 3 is a table showing the variation of the signal-to-noise ratio with the frequency of the input signal fb and the oversampling frequency fs.

DETAILED DESCRIPTION OF THE PREFERRED EMBODIMENT OF THE INVENTION

The decimation filter according to the preferred embodiment of the invention provides a decimation process with a variable decimation factor. Such a variable decimation factor is most useful when considering the wide variety of modems needed in the telecommunication field. Indeed, generally speaking, the value of the decimation factor N is chosen by first considering the signal/noise ratio which is required and then considering the bandwidth of the input signal. Since sigma-delta coders and decoders are likely to be used in a wide variety of different applications, it is highly desirable to provide a sigma-delta coder having a variable and programmable decimation factor as will be shown in the two following examples. A first example can be found by considering a V32 modem or DCE. The echo estimation and cancellation techniques involved in such modems require a signal-to-noise ratio which is at least equal to 80 dB. FIG. 3 shows a table indicating approximate theoretical values of the signal-to-noise ratio as a function of the bandwidth of the input signal fb and also the oversampling frequency fs. It appears in the table that a signal-to-noise ratio of 80 dB is provided in the cases where the ratio fs/fb—i.e., the oversampling factor-is at least equal to 300. Since the bandwidth of such modems is about 3 kHz, the oversampling frequency must be at least equal to 900 khz. If the V32 modem uses four samples per bit time, the decimation factor appears to be equal to 300/4=75. Conversely, when considering a base-band modem which is intended to be connected to a digital network, the bandwidth should be at least equal to 72 kHz. It results that the preceding oversampling ratio (300) would lead to an oversampling frequency of at least 20 mega Hz (300×72 kHz) which is practically unattainable. However, since such a base-band modem does not involve the highly sophisticated echo-cancellation techniques, a signal-to-noise ratio of 60 dB appears to be sufficient. FIG. 3 shows that a signal-to-noise ratio of 60 dB corresponds to an oversampling ratio of at least 64 which results in a decimation factor of 64/2=32 (assuming that the modem is embodied with sigma-delta coders using two samples per bit time).

The decimation circuit used in the present invention simultaneously performs the filtering and decimation function by computing one filtered output over N samples in accordance with the following transfer function:

$$H(f) = \left( \frac{\sin\left(\frac{N\pi f}{fs}\right)}{N \sin\left(\frac{\pi f}{fs}\right)} \right)^p \quad \text{(relation 1)}$$

which is particularly well suited for decimation purposes. The coefficients of the digital filter results from the Z transfer function:

$$\begin{aligned} H(Z) &= \left( \frac{1 - Z^{-N}}{1 - Z^{-1}} \right)^3 \quad \text{(relation 2)} \\ &= (1 + Z^{-1} + \ldots + Z^{-(N-1)})^3 \\ &= C_0 + C_1 Z^{-1} + \ldots + C_{(3N-3)} Z^{-(3N-3)} \end{aligned}$$

Figure 5:
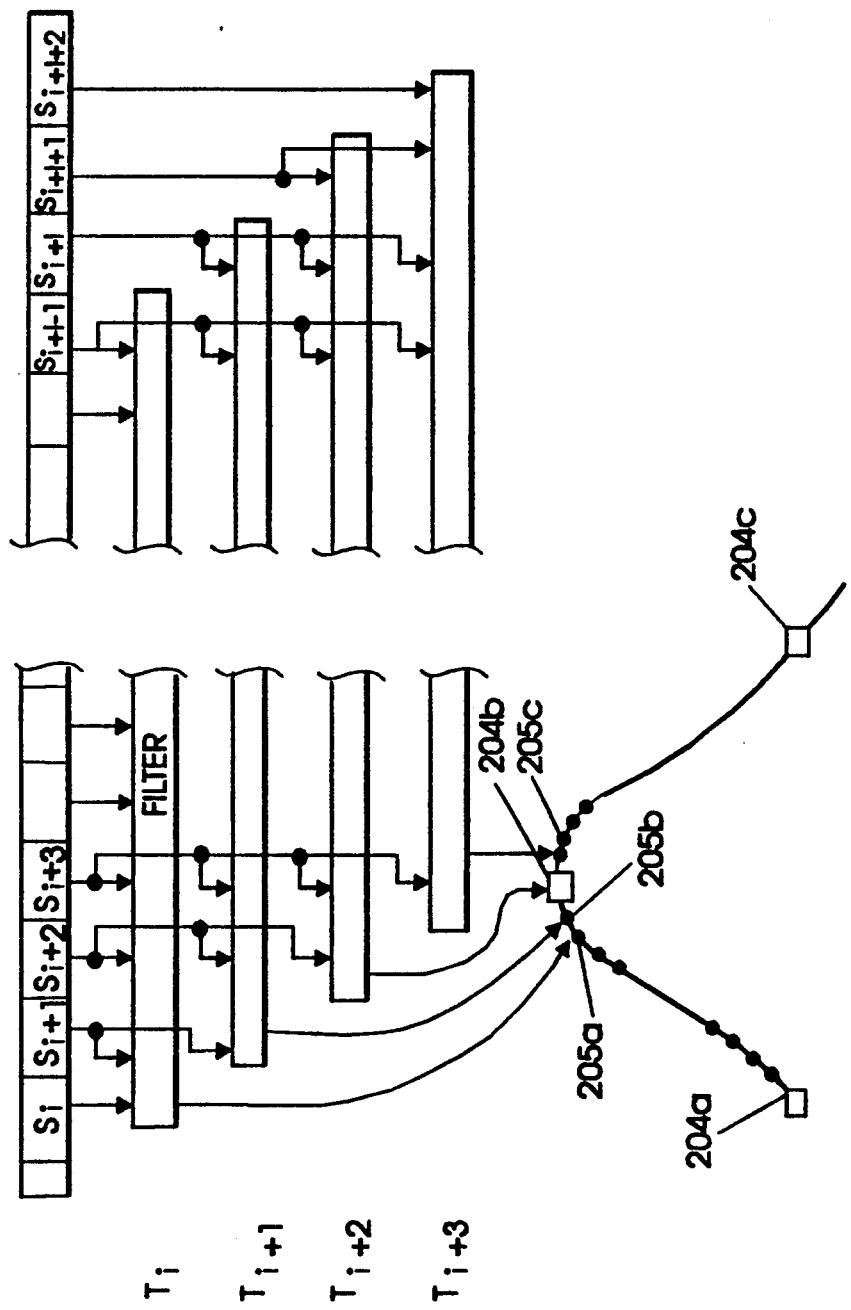
FIG. 5 illustrates the processes of phase control involved in the decimation filter according to the present invention.

The computation of one PCM sample by the digital processing system included in the apparatus according to the present invention is performed with a set of L consecutive input samples S(i). FIG. 5 illustrates the phase control which is achieved by the present invention which controls the computation process of the PCM sample. The decimation filter receives the train of sigma-delta pulses S(i), S(i+1), S(i+2), ... S(i+L−1), S(i+L), S(i+L+1) ... From this train of sigma-delta pulses, the decimation filter computes one PCM sample every N sigma-delta clock periods. The sets of L sigma-delta samples are chosen so that the resulting PCM samples 204a, 204b and 204c are in phase with the receive clock. Therefore, in order to provide the PCM sample 204b corresponding to the instant T(i+2) in FIG. 5, the decimation filter processes the sequence $S(i+2), S(i+3), \ldots, S(i+L+1)$. However, should the modem consider that the sampling instant be made earlier (i.e., that the instant Ti is optimal), the decimation filter according to the present invention computes a sequence of sigma-delta pulses which is shifted by one sigma-delta clock pulse, i.e., the sequence $S(i+1)$, $S(i+2), \ldots, S(i+L)$ resulting in the PCM sample 205b. On the contrary, should the modem consider that the accurate sampling instant be made later (i.e., that the instant $T(i+3)$ appears to be optimal), the decimation filter computes a PCM sample which is delayed of one sigma-delta clock pulse, i.e., the sequence $S(i+3)$, $S(i+4), \ldots, S(i+L+2)$ resulting in the PCM sample 205c. Therefore, the computation process of the different sequences of L input sigma-delta samples provides the possibility of making the PCM sampling instant early or, conversely, later. It should be noticed that the decision to delay or to shift the computation of the PCM pulse is taken by a mechanism which analyses the received signal in order to extract the receive clock which is included therein. Such mechanisms are well known to the skilled man and will not be further detailed. It appears that the control of the computation process of the sigma-delta pulses resulting in the PCM sample provides phase control in the modem.

In the preferred embodiment of the invention, the value of p is chosen to be equal to 3. In this case, the computation of one PCM sample by the digital processing system included in the apparatus according to the present invention is performed with a set of $L=3 \times N$ consecutive input samples $S(i)$, with N being equal to the decimation factor. The PCM output sample is equal to:

$$\sum_{n=0}^{3N-1} C_n S_{i+n} \quad \text{(relation 3)}$$

The coefficients used for the computation are given by the following formulas deriving from the above relationship (2):

- For $n = 0 \ldots N - 1$ (W0 Window)

$$C_n = n\frac{(n+1)}{2}$$

- For $n = N \ldots 2N - 1$ (W1 Window)

$$C_n = N\frac{(N+1)}{2} + (n - N)(2N - 1 - n)$$

- For $n = 2N \ldots 3N - 1$ (W2 Window)

$$C_n = (3N - n - 1)\frac{(3N - n)}{2}$$

Let us call $$C_{i+1} = C_i + \Delta_i$$

$$\Delta_{i+1} = \Delta_i + \delta_i$$

The following relations can be written:

for $n = 0 \ldots N-1$ $$C_n = n\frac{(n+1)}{2}$$

-continued $$C_{n+1} = (n+1)\frac{(n+2)}{2}$$

$$\Delta_n = n + 1$$

$$\delta_n = +1$$

for $n = N \ldots 2 \times N - 1$ $$C_n = N\frac{(N+1)}{2} + (n - N)(2N - 1 - n)$$

$$C_{n+1} = N\frac{(N+1)}{2} + (n + 1 - N)(2N - n - 2)$$

$$\Delta_n = 3N - 2n - 2$$

$$\delta_n = -2$$

for $n = 2 \times N \ldots 3 \times N - 1$ $$C_n = (3N - n - 1)\frac{(3N - n)}{2}$$

$$C_{n+1} = (3N - n - 2)\frac{(3N - n - 1)}{2}$$

$$\Delta_n = -3N + n + 1$$

$$\delta_n = +1$$

Figure 1A:
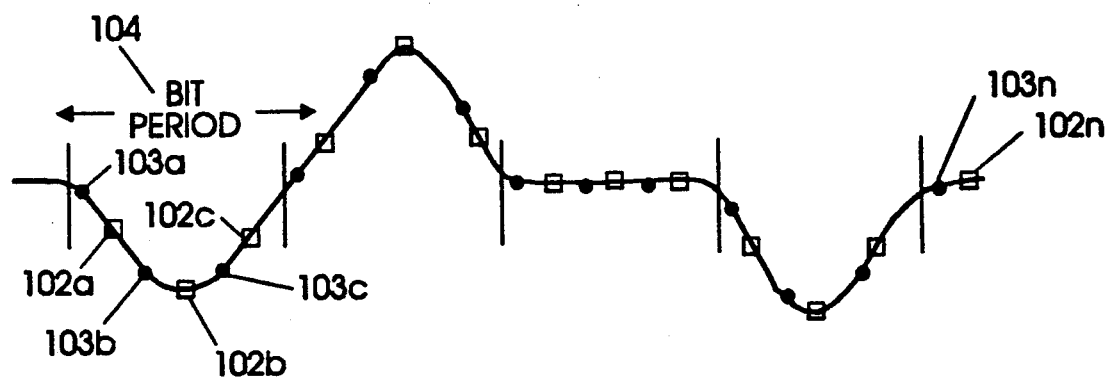
FIG. 1A illustrates the sampling process which is performed on a received bipolar analog signal.
Figure 1B:
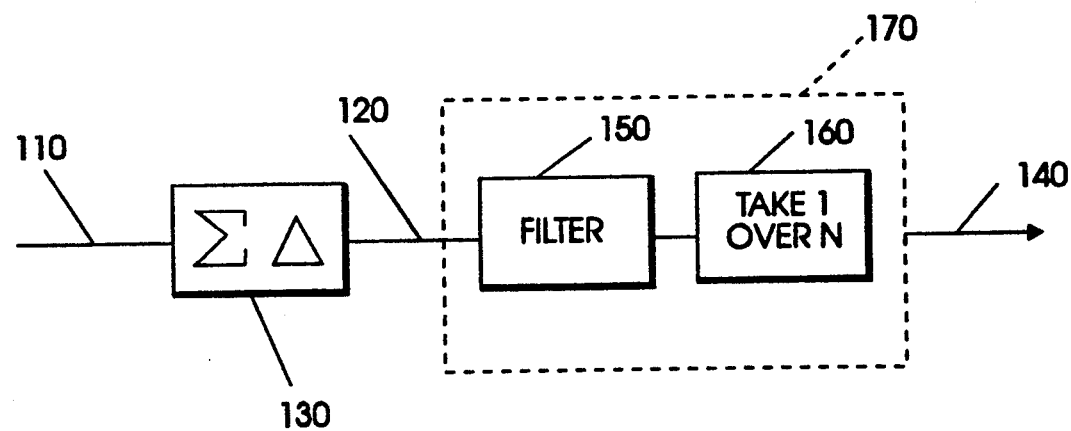
FIG. 1B shows the basic prior art structure of a sigma-delta converter using a decimation filter.
Figure 2A:
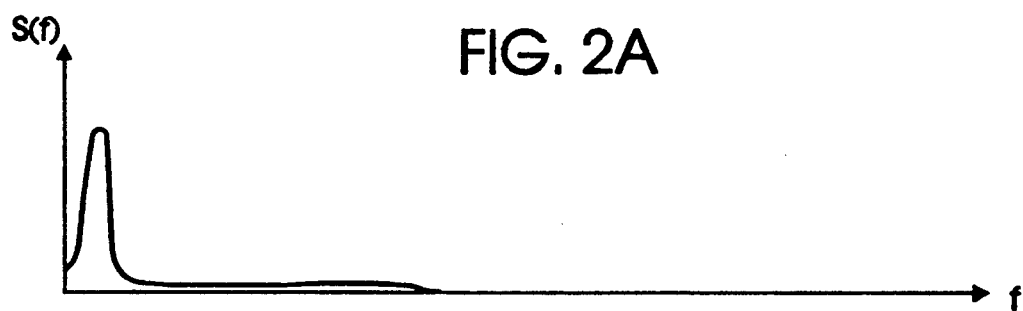
FIGS. 2A-2E show illustrative signal spectra which are involved in the sigma-delta and decimation processes.
Figure 2B:
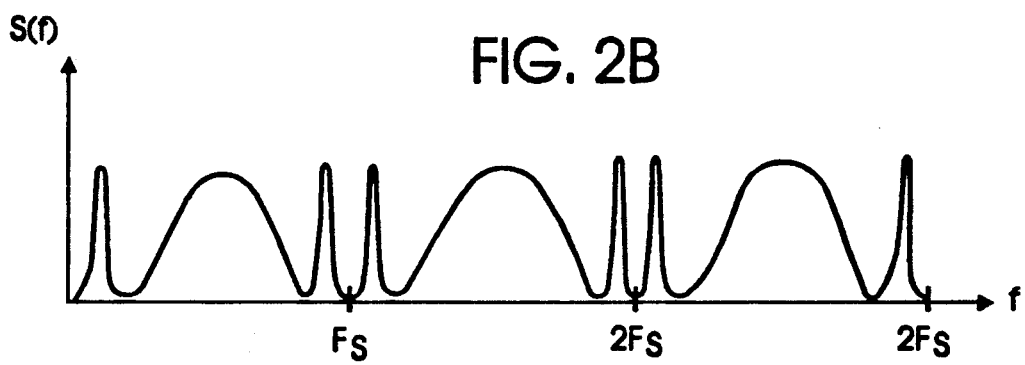
Figure 2C:
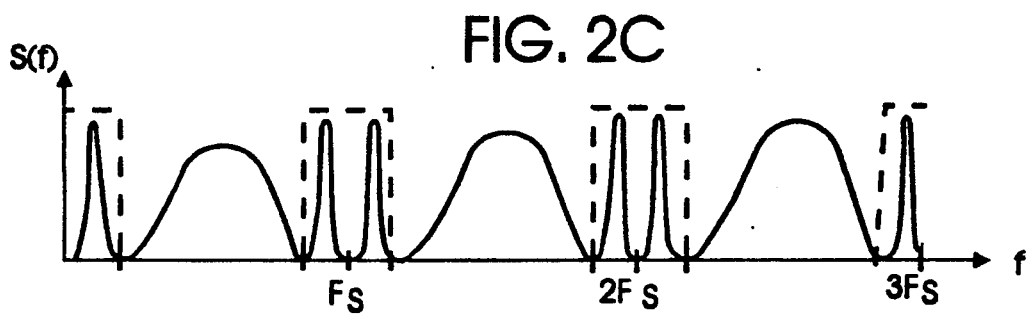
Figure 2D:
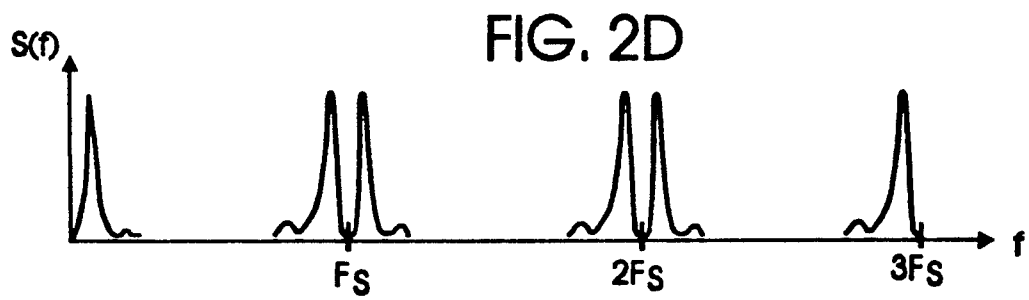
Figure 2E:
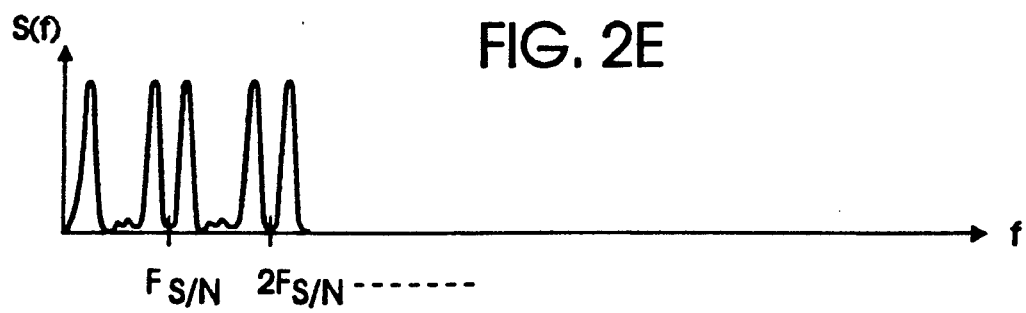
Figure 4:
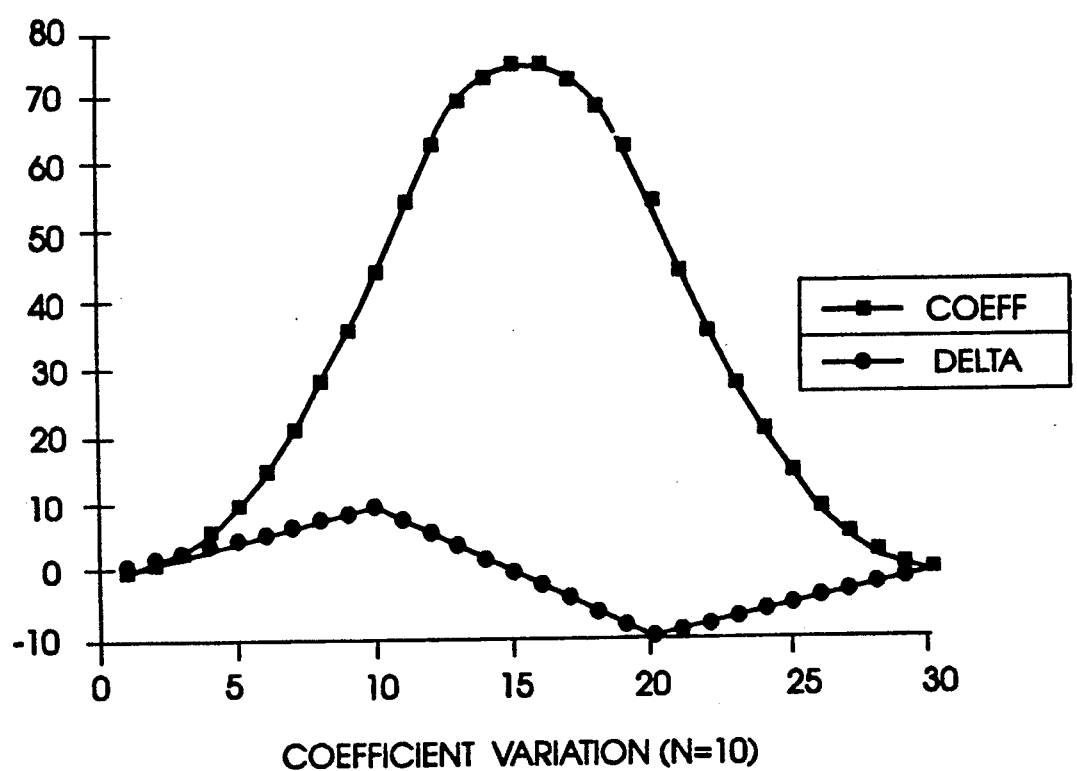
FIG. 4 illustrates the evolution of the coefficients of the filter included in the present invention for a decimation factor of N=10.

Therefore, the filtering coefficients can be divided in three distinctive groups which are characterized by important proprieties: the first group (or window W0) where the difference between two consecutive coefficients is incremented by one at every step from 1 to N; the second group (window W1) where the difference between two consecutive coefficients is decremented by two at every step from N to $2 \times N - 1$; a third group (window W2) where the difference between two consecutive coefficients is incremented by one at every step from $2 \times N$ to $3 \times N - 1$. It should be noticed that this is absolutely independent of the value of the decimation factor N. FIG. 4 illustrates the variation of the coefficients of the filtering function involved in the decimation circuit according to the present invention.

Figure 6A:
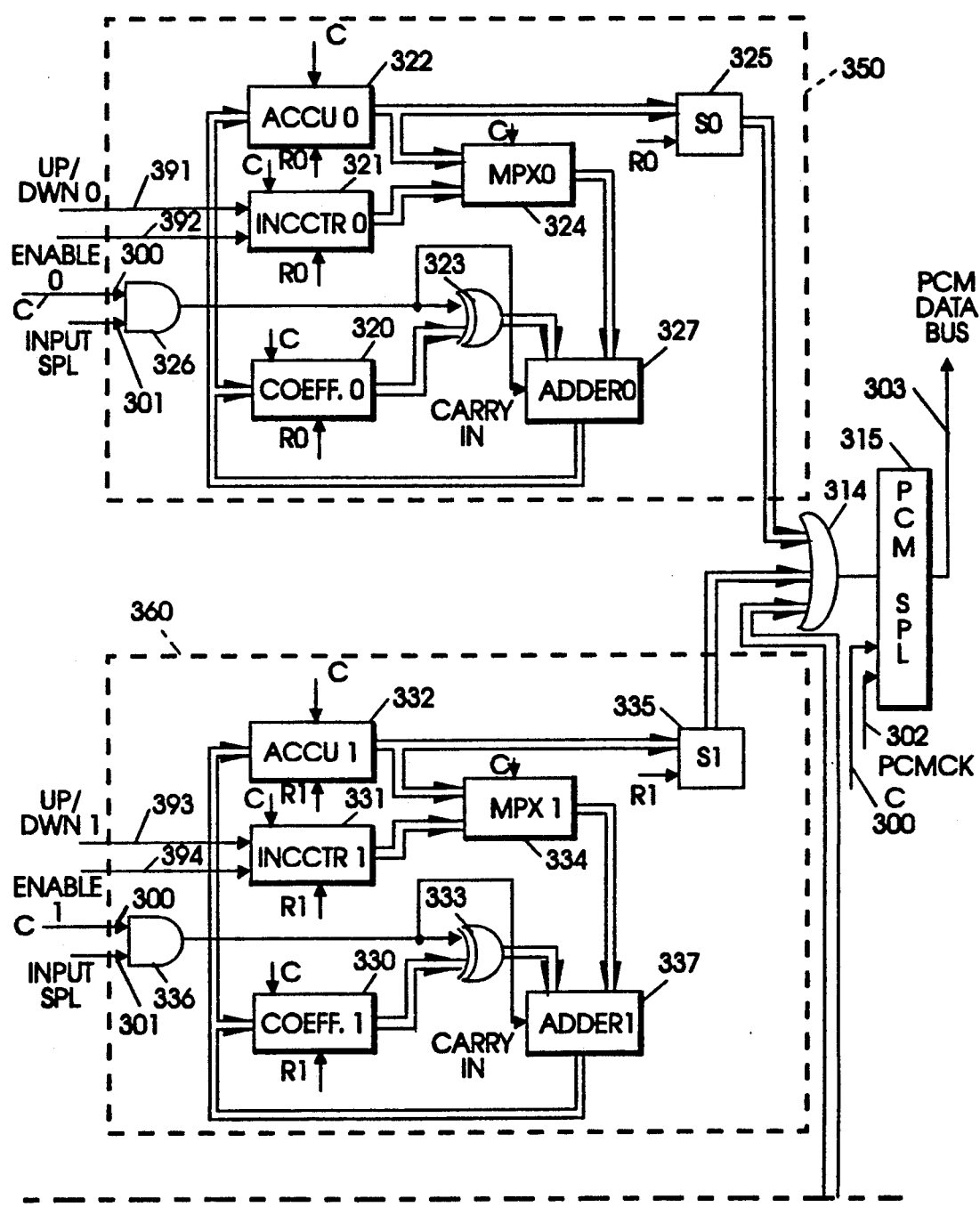
FIGS. 6A-6B show the structure of the decimation filter in accordance with the present invention.
Figures 6, 6B:
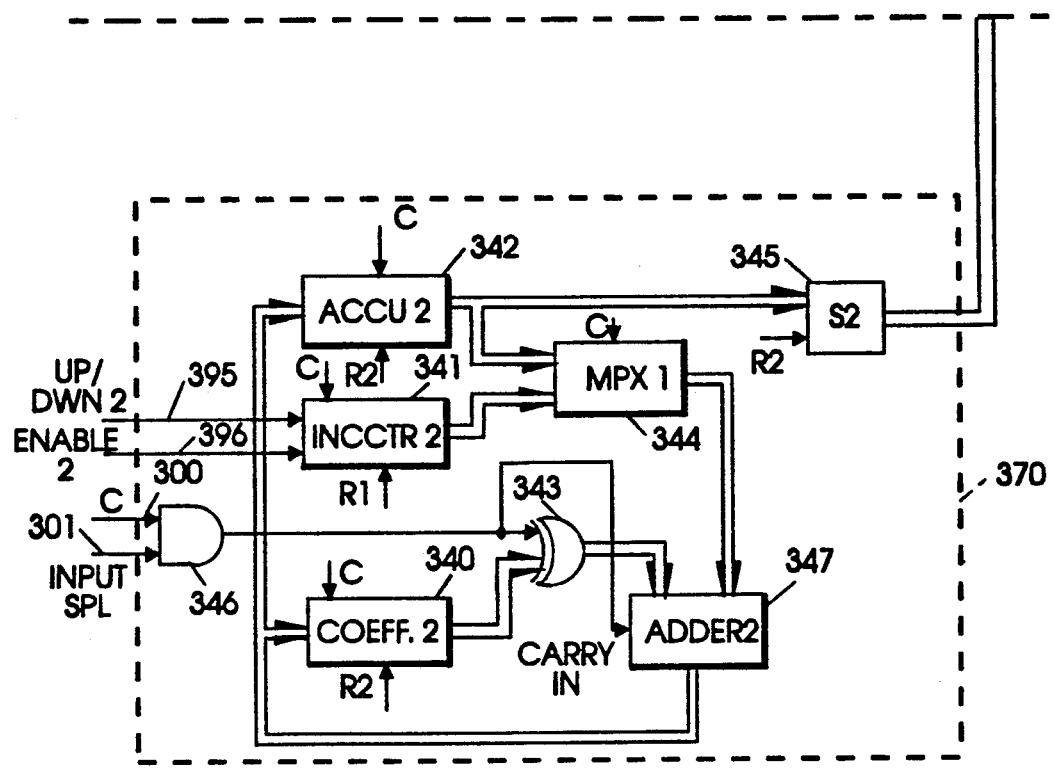
Figure 7A:
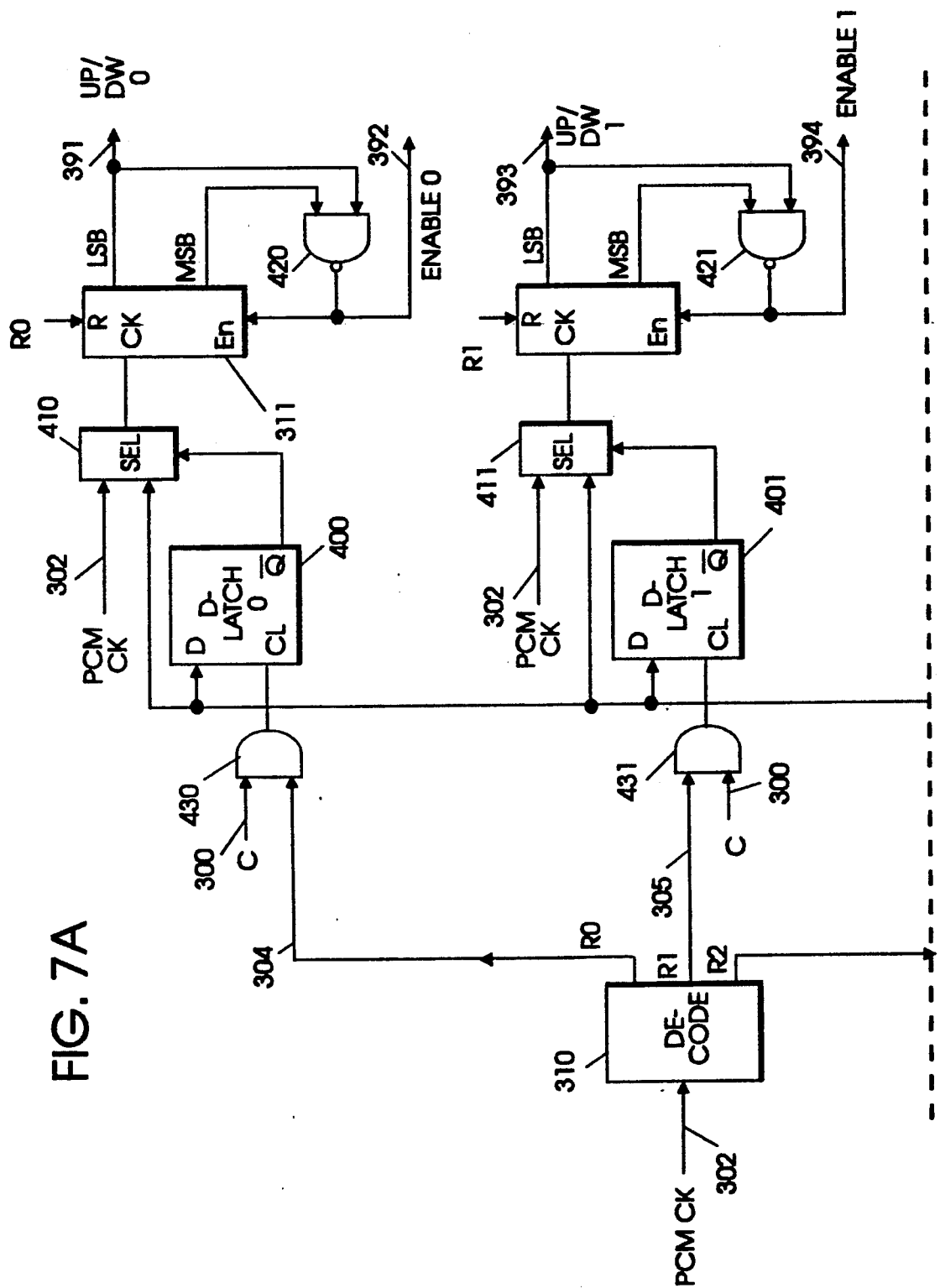
FIGS. 7A-7B illustrate the decoding circuit providing the required clocks.
Figures 7, 7B:
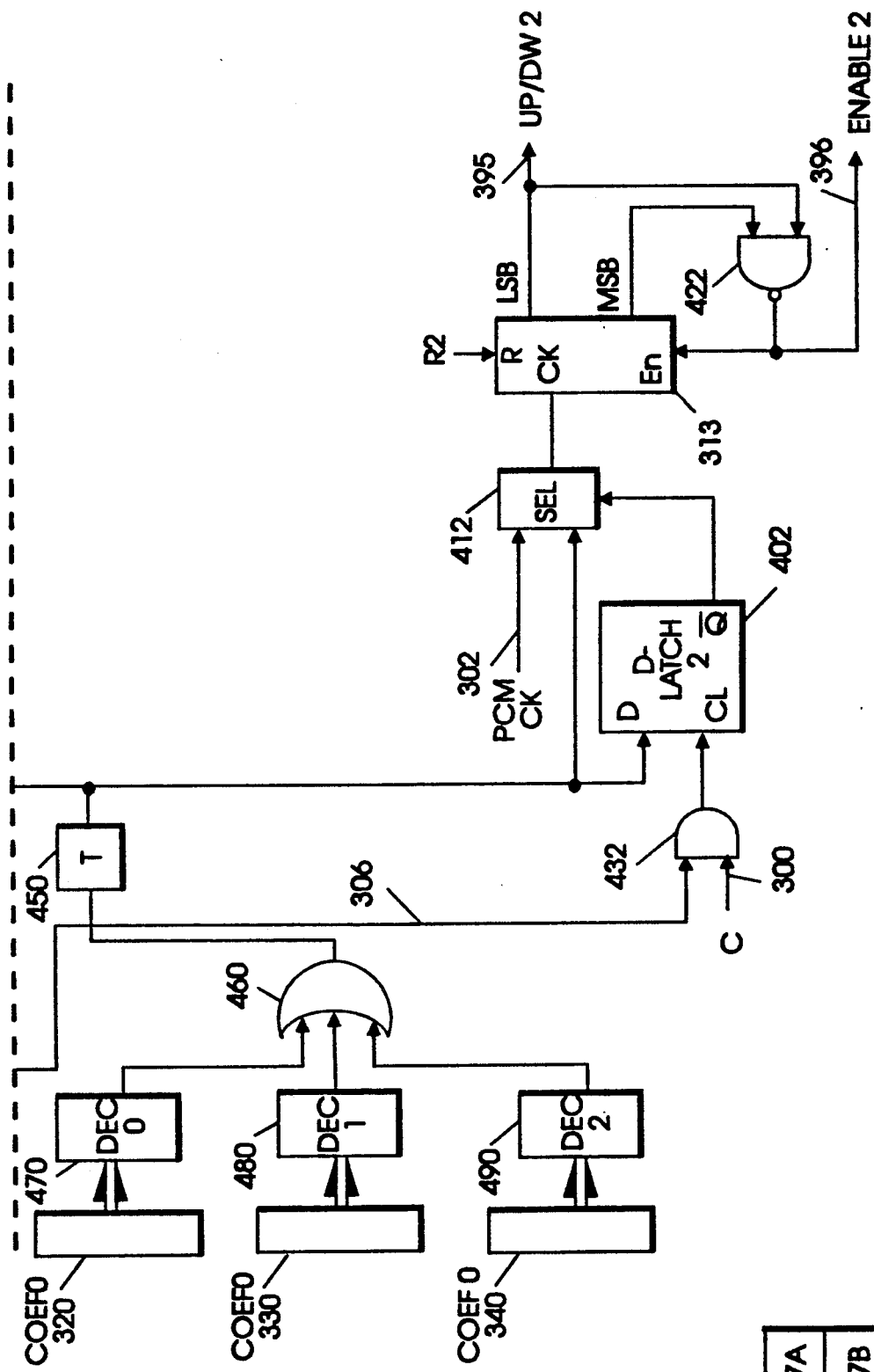

FIGS. 6 and 7 show the decimation circuit of the sigma-delta converter in accordance with the present invention which provides the phase control of the decimation process and successively computes the values of the coefficients C(n) from the generation of the value DELTA(i) in accordance with the following relationship:

$$C(i+1) = C(i) + DELTA(i)$$

As will appear hereinafter, the computing of the coefficients by means of a generation of the sequence of parameters DELTA(i) provides any desired value of the decimation factor N thereby allowing the use of the decimation filter in a wide variety of modems.

FIG. 6 is a detailed structure of the filtering and decimation device which receives a train of sigma-delta pulses on a INPUT SPL lead 301 and which converts this train of pulses into PCM words on a PCM data bus 303. To achieve this, the device also receives the oversampling frequency clock fs (C) on a lead 300 and the PCM clock on a lead 302. The computation of one PCM word is achieved by means of three separate calculations which are respectively performed by three corresponding computation blocks 350, 360 and 370, each computation block computing one PCM sample from a set of 3×N input samples received on lead 301. The computing blocks 350, 360 and 370 are respectively driven by a set of three phase-delayed clocks R0, R1 and R2 which are generated by a decoding circuit 310 receiving the PCM clock on lead 302 as shown in FIG. 7 detailing the clock control architecture of the decimation filter. With respect to FIG. 7, decoding circuit 310 respectively generates the set of three phase-delayed clocks R0, R1, R2 on leads 304, 305 and 306 at a frequency which is a third of the frequency of the PCM clock. Typical waveforms of signal R0, R1 and R2 are shown in FIGS. 8a, 8d, 8g, 8j and FIGS. 9a, 9d, 9g and 9j. The use of the three computing blocks 350, 360 and 370 allows the generation of one PCM sample every N input samples S(i) which eventually provides a full down-sampling process in accordance with the desired decimation factor N.

The first computing block 350 includes a COEFF0 register 320 for storing the value of the coefficients C(n) which will be used in the filtering and decimation process, register 320 having an input bus connected to a corresponding output bus of an ADDER0 adding circuit 327. Block 350 further includes an ACCU0 accumulator 322 having an input bus connected to the output bus of ADDER0 adding circuit 327. As will be explained hereinafter, ADDER0 327 is alternatively used for computing the new calculated coefficient Cn and also the partial PCM result: $C0 \times Si + C1 \times S(i+1) + C2 \times S(i+2) \ldots$ in accordance with relation 3 above. An INCCTR0 counter 321 receiving an Enable0 signal on a lead 392 at its enable input and an UP/DOWN0 control signal on a lead 391 is used for continuously generating the values of DELTA(i). The update of the contents of counter 321 is performed either by an incrementation of one, or a decrementation of two according to the state of the UP/DOWN0 signal existing on lead 391. The output bus of INCCTR0 counter 321 is connected to a first input bus of a MPX0 multiplexing circuit 324 having a second input bus which is connected to the output bus of accumulator 322. MPX0 multiplexor 324 is controlled by the oversampling clock fs (C) on lead 300. MPX0 multiplexing circuit 324 has an output bus which is connected to a first input bus of an ADDER0 adding circuit 327, which circuit 327 has a second input bus connected to the output bus of a XOR circuit block 323. XOR circuit block 323 is a set of XOR circuits each having a first input connected to the output of AND gate 326 and a second input connected to the corresponding lead of output bus of register 320. AND gate 326 has a first input which receives the oversampling clock fs (C) on lead 300 and a second input receiving the input sample of the train of sigma-delta pulses. The output of AND gate 326 is also connected to the "Carry in" input of ADDER0 327. The output of ACCU0 accumulator 322 is connected to the input of gate 325 which transmits the computed PCM sample every 3×N sigma-delta clock pulses to a first input of a set of OR gate 314. COEFF0 circuit 320, INCCTR0 counter 321, ACCU0 accumulator 322 and gate 325 receive the first R0 clock which is generated by decoding circuit 310 of FIG. 7. COEFF0 circuit 320, INCCTR0 counter 321 and ACCU0 accumulator 322 also receive the oversampling clock C existing on lead 300.

Similarly, the second computing block 360 includes a COEFF1 register 330 for storing the value of the coefficients C(n) of the filtering/decimation process, register 330 having its inputs connected to the corresponding outputs of a ADDER1 adding circuit 337. Block 360 further includes an ACCU1 accumulator 332 having its input bus connected to the output bus of ADDER1 adding circuit 337. As will be described hereinafter, ADDER1 337 is alternatively used for computing the new calculated coefficient and also the result of the computed value $C0 \times Si + C1 \times S(i+1) + C2 \times S(i+2)$ in accordance with the relation 3 above. An INCCTR1 counter 331 receives Enable1 signal on a lead 394 at its enable input and a UP/DOWN1 control signal on a lead 393 is used for continuously generating the values of DELTA(i) required for processing the second set of sigma-delta samples required for computing block 360. The update of counter 331 is performed either by an incrementation of one, or a decrementation of two according to the state of the UP/DOWN1 control signal on lead 393. The output bus of INCCTR1 counter 331 is connected to a first input bus of a MPX1 multiplexing circuit 334 having a second input bus connected to the output bus of accumulator 332 and which is controlled by the oversampling clock fs (c) on lead 300. MPX1 multiplexing circuit 334 has an output bus which is connected to a first input bus of an ADDER1 adding circuit 337, which circuit 337 has a second input bur connected to the output bus of XOR circuit block 333. XOR circuit block 333 is a set of XOR circuits each having a first input connected to the output of AND gate 336 and a second input connected to the corresponding lead of the output bus of register 330. AND gate 336 has a first input which receives the oversampling clock fs (c) on lead 300 and a second input receiving the input sample coming from the sigma-delta converter. The output of AND gate 336 is also connected to the "Carry in" input of ADDER1 337. The output of ACCU1 accumulator 332 is connected to the input of gates 335 which outputs the PCM sample computed by block 360 every 3×N sigma-delta clock pulses and which is transmitted to a second input bus of the set of OR gate 314. As for above, COEFF1 circuit 330, INCCTR1 counter 331, ACCU1 accumulator 332 and gates 335 receive the second R1 clock which is generated by decoding circuit 310 of FIG. 7. COEFF1 circuit 330, INCCTR1 counter 331 and ACCU1 accumulator also receive the oversampling clock fs (c) existing on lead 300.

Similarly to the above, the third computing block 370 includes a COEFF2 register 340 for storing the value of the coefficients C(n) needed for the filtering/decimation process of the third series of 3×N input samples which is processed by computing block 370. Register 340 has an input bus which is connected to the output bus of an ADDER2 adding circuit 347. Block 370 further includes an ACCU2 accumulator 342 having its input bus connected to the output bus of ADDER2 adding circuit 347. As will be described hereinafter, ADDER2 347 is alternatively used for computing the new calculated coefficient and also the result of the computed value $C0 \times Si + C1 \times S(i+1) + C2 \times S(i+2) \ldots$ in accordance with relation 3 above. INCCTR2 counter 341 receives a Enable2 signal on a lead 396 at its enable input and a UP/DOWN2 control signal on a lead 395 is used for continuously generating the values of DELTA(i) required to process the third set of 3×N sigma-delta samples by computing block 370. Similarly to INCCTR0 and INCCTR1 counters 321 and 331, the update of delta in INCCTR2 block 341 is performed either by an incrementation of one, or a decrementation of two according to the state of UP/DOWN2 control signal on lead 395. The output bus of INCCTR2 counter 341 is connected to a first input bus of a MPX2 multiplexing circuit 344 having a second input bus connected to the output bus of accumulator 342 and which is controlled by the oversampling clock C on lead 300. MPX2 multiplexing circuit 344 has output bus which is connected to a first input bus of an ADDER2 adding circuit 347, which circuit 347 has a second input bus connected to the output bus of XOR circuit block 343. XOR circuit block 343 is a set of XOR circuits each having a first input connected to the output of AND gate 346 and a second input connected to the corresponding lead of the output bus of register 340. AND gate 346 has a first input which receives the oversampling clock fs (c) on lead 300 and a second input receiving the input sample coming from the sigma-delta converter. The output of AND gate 346 is also connected to the "Carry in" input of ADDER2. The output of ACCU2 accumulator 342 is connected to the input of gates 345 which outputs the desired PCM sample every $3 \times N$ sigma-delta clock period and which transmits it to a third input bus of a set of OR gate 314. Similar to the above, COEFF2 circuit 340, INCCTR2 counter 341, ACCU2 accumulator 342 and gates 345 receive the third R2 clock which is generated by decoding circuit 310 of FIG. 7. COEFF2 circuit 340, INCCTR2 counter 341 and ACCU2 accumulator also receives the oversampling clock fs (c) existing on lead 300.

The operation of the filtering/decimation circuit of FIGS. 6 and 7 according to the present invention is as follows:

Considering the first computing block 350: at every clock period of the oversampling clock fs (C) existing on lead 300, counter 321 generates the following element of the sequence DELTA(i) illustrated in FIG. 4 by means of either an incrementation of one or a decrementation of two according to the state of UP/DOWN0 signal on lead 391. Then, the update of the coefficient Cn is performed in register 320. To achieve this, during the first half of the oversampling clock period fs (C)—i.e., when the fs clock on lead 300 is at its low level- MPX0 multiplexing circuit 324 transmits the value DELTA(i) carried by the output bus of INCCTR0 counter 321 to the first input bus of ADDER0 circuit 327. The second input bus of ADDER0 circuit 327 receives the contents of COEFF0 register 320 via XOR 323 because the output of AND gate 326 is set to a low level since the oversampling clock fs (C) on lead 300 is also at a low level. Similarly, the "Carry in" input of ADDER0 327 is at a low level. ADDER0 circuit 327 therefore performs the computation: Cn=c(n−1)+DELTA(n−1) and the result Cn is stored in COEFF0 register 320 at the rising edge of the sigma-delta clock period, that is to say, at the end of the first half of the sigma-delta clock period. During the second half of the oversampling clock period—i.e., when the latter clock is at a high level—, MPX0 multiplexing circuit 324 transmits the contents of ACCU0 accumulator 322 to the first input bus of ADDER0 adding circuit 327 while its second input bus receives the output of XOR gates 323. XOR gates 323 transmits to ADDER0 adding circuit 327 the contents of COEFF0 register 320 or its inverse according to the value of the input sample SPL which is existing on lead 301 during the second half of the oversampling clock period. In the same time, the value of the input sample SPL is presented to ADDER0 327 "Carry in" input lead through AND gate 326. This provides a very simple way to achieve the computation of the term referred to in relation 3 above. Therefore, during that second half of the sigma-delta clock period, the input sigma-delta sample S(i+n) on lead 301 is multiplied by the value of the coefficient Cn stored in register 320 and the result $C(n) \times S(i+n)$ is added to the contents of ACCU0 accumulator 322 by ADDER0 adding circuit 327. The result of the latter addition, i.e., the partial computation of the PCM sample $C(0) \times S(i)+C(1) \times S(i+1)+C(2) \times S(i+2) \ldots$ is loaded into ACCU0 accumulator 322 on the falling edge of the oversampling clock fs, i.e., at the end of the second half of the clock period of the sigma-delta clock fs. INCCTR0 counter 321 is used to continuously generate the sequence DELTA(i) which is needed in the computation of the PCM sample by control block 350 and operates as follows: when the state of UP/DOWN0 signal 391 is low, INCCTR0 counter 321 is incremented by one when the oversampling clock fs (c) on lead 300 switches to a high level. Conversely, when the state of Up/Down signal 391 is set to a high level, INCCTR0 counter 321 is decremented by two on the rising edge of the oversampling clock period on lead 300. The incrementation/decrementation process of INCCTR0 counter 321 is enabled only when Enable0 signal on lead 392 is set to a high level. The structure of INCCTR0 counter 321 is well known to the skilled man and will not be detailed. Therefore, INCCTR0 counter 321 stores at every clock period, and more accurately at every half of the oversampling clock period when the latter switches to a high level, the value of DELTA which will be used to update the value of the coefficient Cn needed to compute the PCM sample in accordance with the relation Cn=C(n−1)+DELTA(n−1). The latter update of the value of the coefficient Cn occurs during the first half of the next clock period. R0 clock generated by decoding circuit 310 of FIG. 7 is used to reset the different registers and counters: COEFF0 register 320, INCCTR0 counter 321, and counter 311 are reset when the R0 clock on lead 304 switches to a high level. Conversely, ACCU0 accumulator 322 is reset when the latter R0 clock switches to a low level.

The generation of UP/DOWN0 and ENABLE0 control signals respectively on lead 391 and 392 results in the contents of INCCTR0 counter 321 fully conforming to the diagram of FIG. 4 illustrating the variation of the value of delta(i). Therefore, at the end of $3 \times N$ consecutive oversampling clock periods, the ACCU0 accumulator 322 is loaded with the value of one PCM sample derived from the sigma-delta pulses according to the formula:

$$\sum_{n=0}^{3N-1} C_n S_{i+n}$$

The PCM sample is transmitted to the output of gates 325 at every pulse of the R0 clock and received at the first input of OR gate 314. Since a number of $3 \times N$ input samples have been required to generate the PCM output sample which was computed by block 350, the PCM samples generated by block 350 appear at a frequency of fs/3N.

Computing blocks 360 and 370 operate similarly to computing block 350 but are only phase-delayed since block 360 (resp. block 370) is driven by the phase-delayed R1 clock (resp. R2 clock) which is generated by decoding circuit 310 on lead 305 (resp. 306) of FIG. 7. Briefly, computing block 360 (resp. 370) operates as follows: at every clock period of the oversampling clock fs (c) existing on lead 300, counter 331 (respectively 341) computes the new value of DELTA under control of counter 312 (resp. 313). For this, during the first half of the oversampling clock period fs (c), MPX1 multiplexing circuit 334 (resp. MPX2 multiplexing circuit 344) transmits the value DELTA(n−1) at the output of INCCTR1 counter 331 (resp. 341) to the first input bus of ADDER1 337 (resp. ADDER2 347). The second input bus of ADDER1 337 (resp. ADDER2 347) receives the contents C(n−1) of COEFF1 register 330 (resp. COEFF2 register 340) via XOR 333 (resp. 343) because the output of AND gate 336 (resp. 346) is set to a low level. Similarly, the input "Carry in" of ADDER1 (resp. ADDER2) is at a low level. ADDER1 circuit 337 (resp. ADDER2 circuit 347) performs the computation $c(n)=c(n-1)+DELTA(n-1)$. The result of the latter computation is stored again into COEFF1 register 330 (resp. COEFF2 register 340) on the rising edge of the oversampling clock period fs (c), i.e., at the end of the first half of that clock period. As for above, during the second half of the clock period, MPX1 multiplexing circuit 334 (resp. MPX2 multiplexing circuit 344) transmits the contents of ACCU1 accumulator 332 (resp. ACCU2 342) - carrying the partial result of the PCM sample computation $C(0) \times S(i+1) + C(1) \times S(i+2) + C(2) \times S(i+3) + \ldots$ (resp. $C(0) \times S(i+2) + C(1) \times S(i+3) + C(2) \times S(i+4) + \ldots$) —to the first input bus of ADDER1 circuit 337 (resp. ADDER2 347) while its second input bus receives the output of XOR gates 333 (resp. XOR 343). In the same time, the value of the input sample SPL is presented to ADDER1 (resp. ADDER2) "Carry in" input through AND gate 336 (resp. AND gate 346). Therefore, during the second half of the sigma-delta clock period, the input sigma-delta sample S(i+n) on lead 301 is multiplied by the value of the coefficient C(n) which has been computed before and stored into register 330 (resp. register 340). The product $C(n) \times S(i+n)$ is added to the contents of ACCU1 accumulator 332 (resp. ACCU2 accumulator 342) by ADDER1 circuit 337 (resp. ADDER2 circuit 347). The result of the latter addition, corresponding to the partial result of the PCM sample computed by block 360 (resp. 370), is loaded into ACCU1 accumulator 332 (resp. ACCU2 accumulator 342) on the falling edge of the oversampling clock fs (c), i.e., at the end of the second half of the clock period. INCCTR1 counter 331 (resp. INCCTR2 counter 341) is used to continuously generate the sequence DELTA(n) needed to compute the coefficients C(n) and operates as follows: when the status of UP/DOWN1 signal (resp. UP/DOWN2 signal) on lead 393 (resp. on lead 395) is low, INCCTR1 counter 331 (resp. INCCTR2 counter 341) is incremented by one on the rising edge of the oversampling clock. Conversely, when UP/DOWN1 control signal (resp. UP/DOWN2 control signal) is high, INCCTR1 counter 331 (resp. INCCTR2 counter 341) is decremented by two on the rising edge of the oversampling clock on lead 300. Therefore, INCCTR1 counter 331 (resp. INCCTR2 counter 341) stores on every rising edge of the oversampling clock the value of DELTA(n) which will be used to compute the new coefficient C(n). As for above, the latter update of the value of the coefficient C(i) will occur during the first half of the next clock period. R1 (resp. R2) clock generated by decoding circuit 310 of FIG. 7 is used to reset the different registers and counters: COEFF1 register 330, INCCTR1 counter 331 and counter 312 (resp. COEFF2 register 340, INCCTR2 counter 341 and counter 313) are reset at the rising edge of the R1 clock (resp. R2). On the other hand, ACCU1 accumulator 332 (resp. ACCU2 accumulator 342) is reset on the falling edge of the R1 clock (resp. R2 clock). At the end of $3 \times N$ consecutive oversampling clock periods, a PCM pulse is available in ACCU1 accumulator 332 (resp. ACCU2 accumulator 342). The latter PCM sample is transmitted to the second (resp. third) input of OR gate 314 by the means of gates 335 (resp. 345) which are controlled by R1 clock (resp. R2 clock). The generation of the different coefficients C(n) which are required in the decimation process for every computing block 350, 360 and 370 is particularly illustrated with respect to FIG. 10.

Figure 10:
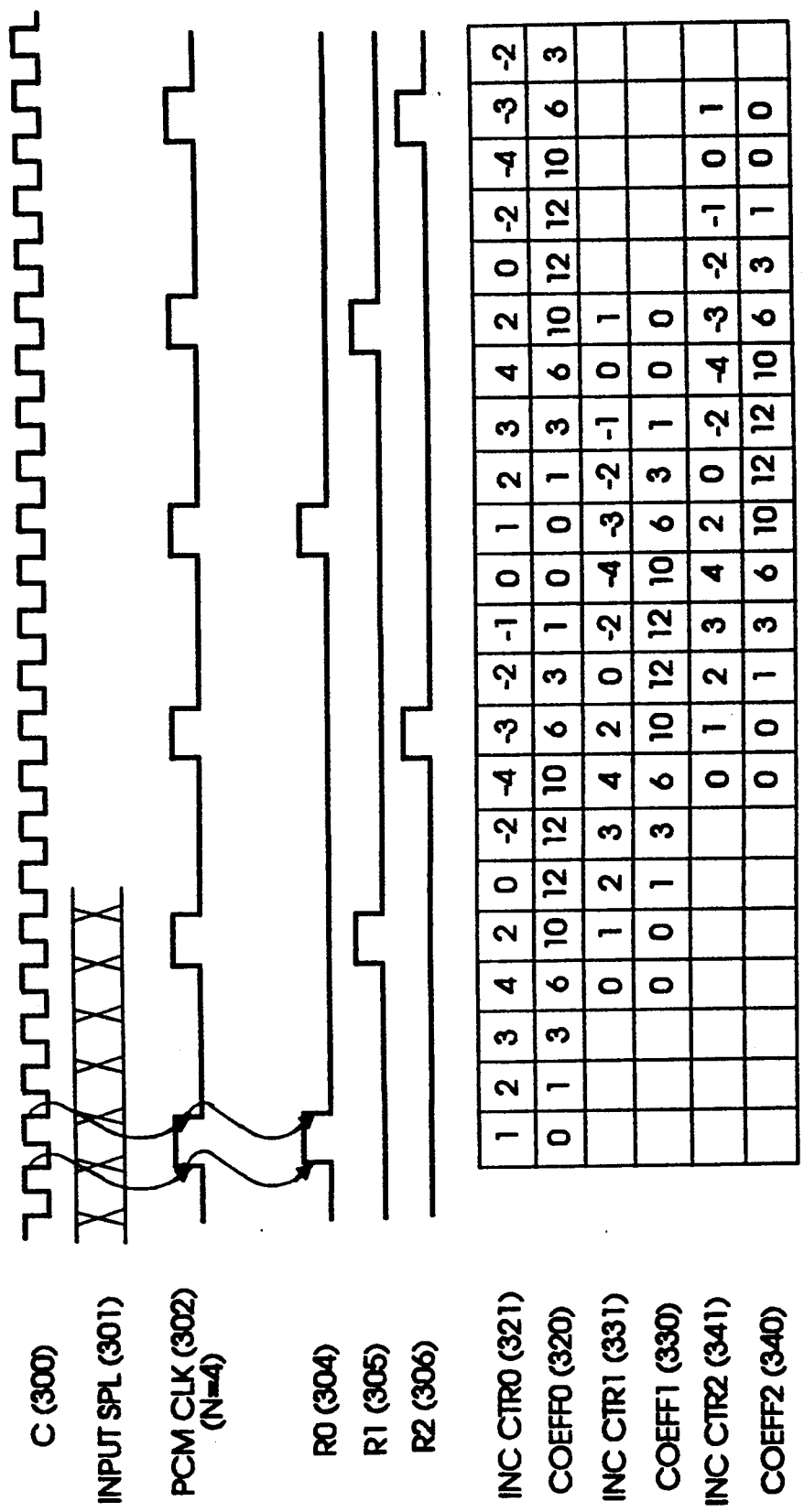
FIG. 10 is a timing diagram illustrating the evolution of the contents of COEFF0, COEFF1 and COEFF2 registers with time.

As a conclusion, the set of three computing block 350, 360 and 370, each generating one PCM sample every $3 \times N$ input sample which is transmitting to one input of OR gate 314, produces a train of PCM samples at a frequency of fs/N. The output of OR gate 314 is connected to the input of a register 315 which provides the PCM word on a PCM data bus 303 at the desired fs/N frequency. It should be noticed however that FIG. 10 shows the operation of the computing block when no phase-control is introduced in the decimation process. The phase-control mechanism, and particularly the generation of the different clock signals: UP/DOWN0, UP/DOWN1, UP/DOWN2, Enable0, Enable1 and Enable2 signals will be described with reference to FIG. 7. COEFF0 register 320, COEFF1 register 330 and COEFF2 register 340 are respectively connected to a DECODE0 circuit 470, to a DECODE1 circuit 480 and to a DECODE2 circuit 490 which are used to detect when the contents of the corresponding register reaches the value 0 corresponding to the coefficient $C(3 \times N - 1)$. The output of circuits 470, 480 and 490 is entered into an OR gate 460, which output is connected to the input of a delay circuit 450. Delay circuit 450 is used for delaying the positive pulse generated by OR gate 460 of one sigma-delta clock pulse. The output of delay circuit 450 is then connected to the D-input of a set of three D-latch circuits 400, 401 and 402. D-latch circuit 400 is associated with a selector 410, a counter 311, an AND gate 430 and a NAND 420 which constitute a circuit receiving the R0 clock from decode circuit 310 and which generates the UP/DOWN0 and Enable0 signals which are required by the first computing block 350 of FIG. 6, and particularly INCCTR0 counter 321. More accurately, AND gate 430 receives at its first input the R0 clock signal generated by decode circuit 310 from the PCM clock and at its second input the sigma-delta clock on lead 300. The output of AND gate 430 is transmitted to the clock input of D-latch 400, which inverted output is connected to the control input of selector 410 receiving the output signal, hereinafter called the pseudo clock signal of delay circuit 450 and the PCM clock existing on lead 302. The output of selector 410, carrying either the PCM clock or the output signal of delay circuit 450 according to the state of inverted output of D-latch 400, is transmitted to the clock input of counter 311 receiving the R0 clock signal at its reset input. Counter 311 is a two bit-counter whose LSB is used for generating the required UP/DOWN0 signal on lead 391 and whose Most Significant Bit is transmitted to a first input of NAND gate 420 receiving the LSB at its second input. The output of NAND 420 generates a signal which is transmitted to the Enable input of counter 311 and which is also used for generating the Enable0 signal on lead 392.

Similarly D-latch circuit 401 is associated with a selector 411, a counter 312, an AND gate 431 and a NAND 421 which constitute a circuit receiving the R1 clock from decode circuit 310 and which generates the UP/DOWN1 and Enable1 signals which are required by the second computing block 360 of FIG. 6, and particularly INCCTR1 counter 331. AND gate 431 receives at its first input the R1 clock signal which is generated by decode circuit 310 from the PCM clock and which is delayed with respect to the R0 clock signal such as shown in FIG. 8g and 9g. AND gate 431 receives at its second input the sigma-delta clock on lead 300 and has an output which is connected to the clock input of D-latch 401, which inverted output is connected to the control input of selector 411. Selector 411 receives at its first input the output signal of delay circuit 450 and at its second input the PCM clock existing on lead 302. The output of selector 411, carrying either the PCM clock or the output signal of the delay circuit 450 according to the state of inverted output of D-latch 401, is transmitted to the clock input of counter 312 receiving the R1 clock signal at its reset input. Counter 312 is a two bit-counter whose LSB is used for generating the required UP/DOWN1 signal on lead 393 and whose Most Significant Bit is transmitted to a first input of NAND gate 421 receiving the LSB at its second input. The output of NAND 421 generates a signal which is transmitted to the Enable input of counter 312 and which is also used for generating the Enable1 signal on lead 394.

D-latch circuit 402 is associated with a selector 412, a counter 313, AND gate 432 and a NAND 422 which constitute a circuit receiving the R2 clock from decode circuit 310 and which generates the UP/DOWN2 and Enable2 signals which are required by the third computing block 360 of FIG. 6, and particularly INCCTR2 counter 341. AND gate 432 receives at its first input the R2 clock signal which is generated by decode circuit 310 from the PCM clock and which is delayed with respect to the R1 clock signal such as shown in FIG. 8j and 9j. AND gate 432 receives at its second input the sigma-delta clock on lead 300 and has an output which is connected to the clock input of D-latch 402, which inverted output is connected to the control input of selector 412. Selector 412 receives at its first input the output signal of delay circuit 450 and at its second input the PCM clock existing on lead 302. The output of the selector 412, carrying either the PCM clock or the output signal of delay circuit 450 according to the state of inverted output of D-latch 402, is transmitted to the clock input of counter 313 receiving the R2 clock signal at its reset input. Counter 313 is a two bit-counter whose LSB is used for generating the required UP/DOWN2 signal on lead 395 and whose Most Significant Bit is transmitted to a first input of NAND gate 422 receiving the LSB at its second input. The output of NAND 422 generates a signal which is transmitted to the Enable input of counter 313 and which is also used for generating the Enable2 signal on lead 396

Figure 8:
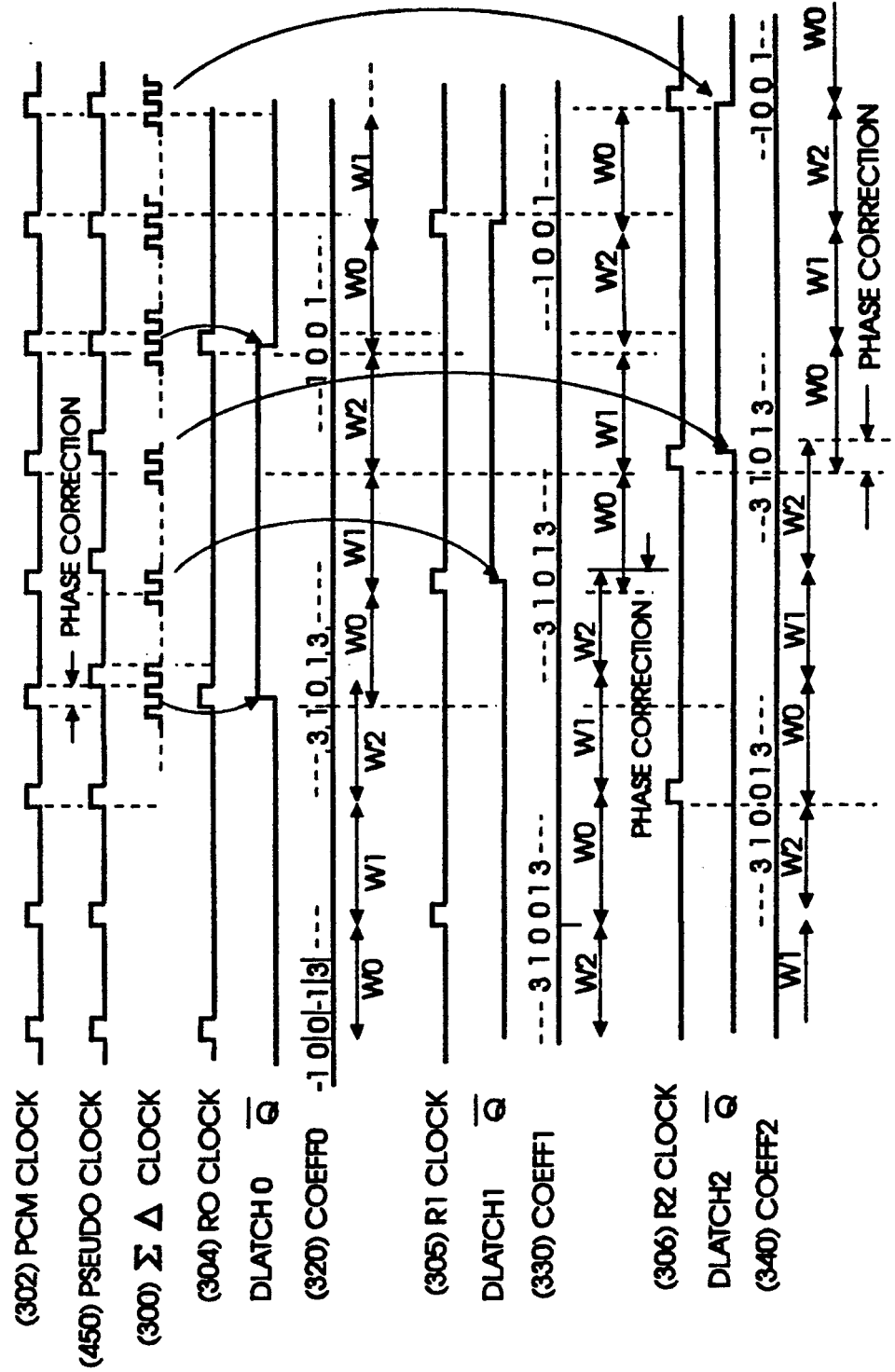
FIGS. 8A-8L and 9A-9L are timing diagrams illustrating the operation of the invention.
Figure 9:
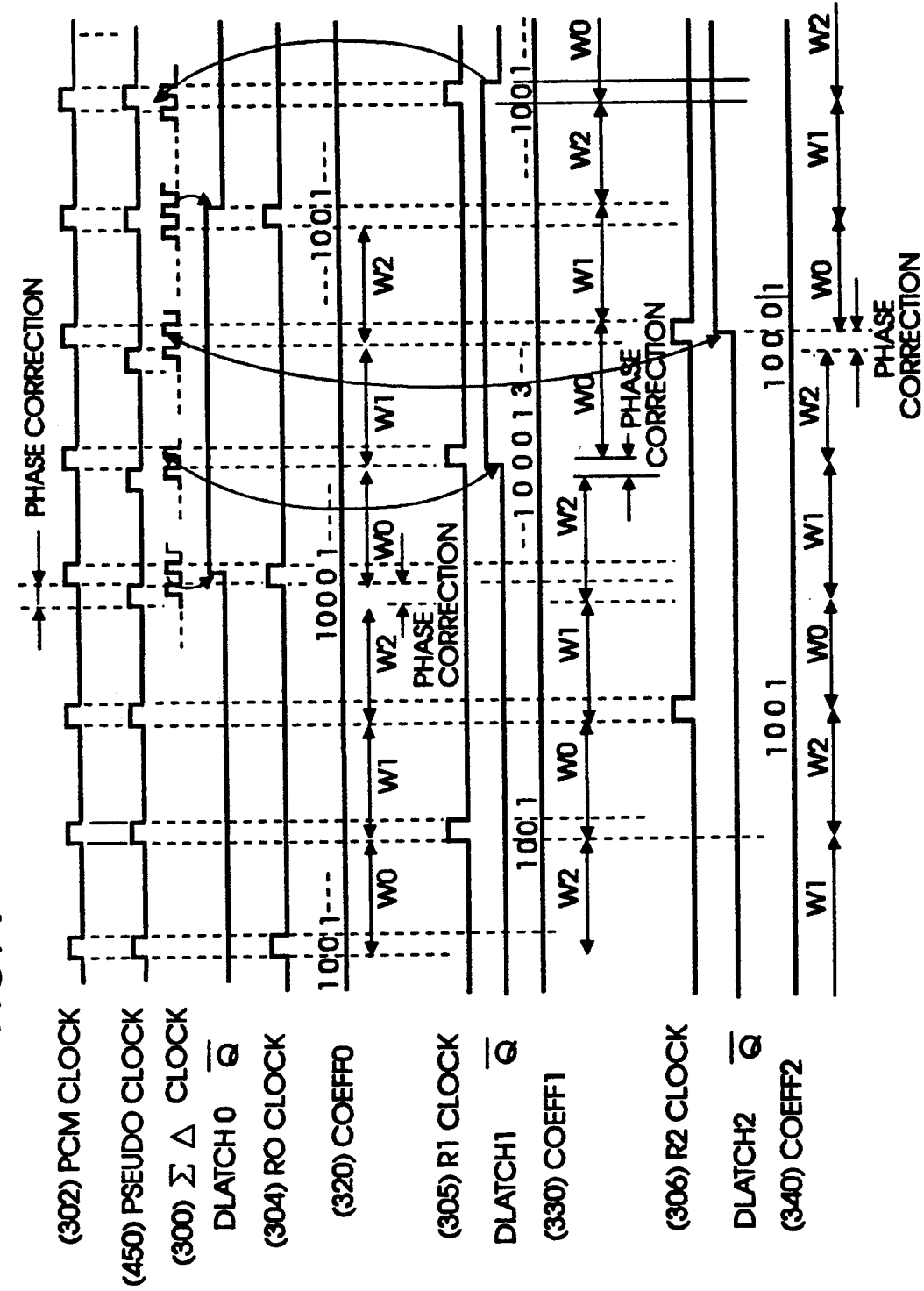

Each of the D-latches 400, 401 and 402 and its associated components operates in a similar manner which is illustrated in FIGS. 8 and 9. Below is particularly described the operating of D-latch 400 and its associated components for providing the required UP/DOWN0 and Enable0 signals for the first computing block 350.

Each of decode circuits 470, 480 and 490 decodes the contents of its associated register in order to detect the occurrence of the coefficient $C(3 \times N-2)$, that is to say the first coefficient being equal to zero which immediately follows the coefficient $C(3 \times N-3)$ which is equal to one. On the occurrence of the coefficient $C(3 \times N-2)$ in one of the three registers 320, 330 and 340, the corresponding decode circuit 470, 480 or 490 generates a positive pulse during a sigma-delta clock period. Each of the pulses generated by decode circuits 470, 480 and 490 is transmitted via OR gate 460 to delay circuit 450 which delays the pulse for one sigma-delta clock period before it is transmitted to the input of D-latches 400, 401 and 402. Delay circuit 450 can be straightforwardly embodied by means of two triggers. The output of delay circuit 450 therefore provides a pseudo clock signal which is normally in phase with the PCM clock on lead 302 when no phase correction is applied such as shown in FIGS. 8a, 8b, 9a and 9b. Conversely, when the modem decides to apply a correction on the PCM clock (either positive or negative), the corresponding correction is also instantaneously applied to the R0 clock on lead 304 by means of decode circuit 310. The diagrams of FIG. 8 illustrate a phase correction in which the PCM clock pulse occurs earlier, while FIG. 9 is dedicated to a phase correction in which the PCM clock is delayed to one sigma-delta clock pulse later. Since the R0 clock signal is used by the first computing block 350 for resetting all the elements therein included, the phase correction introduced in the PCM clock initiates a new computation process of a new sequence of $3 \times N$ sigma-delta samples. The start of the new computation process in block 350 does not jeopardize the exactness of the computation process which was preceding instant when the phase correction occurred. This is of course true if the phase correction is a delay of the PCM pulse as shown in FIG. 9a. However, this is also true in the case of a phase correction in which the PCM pulse is shifted in advance of one sigma-delta clock pulse as shown in FIG. 8a. Indeed, on the occurrence of the advanced PCM pulse as shown in FIG. 8a, the first computing process in block 350 has just completed the process of the sigma-delta input sample corresponding to the coefficient $C(3 \times N-3)$. Coefficient $C(3 \times N-2)$ being equal to zero whatever the value of N is, the computing process appears to be completed and does not need any further processing step. A new computation process can therefore start on the occurrence of the shifted PCM clock pulse without jeopardizing the exactness of the preceding one. On the contrary, as shown in FIGS. 8i and 8l and also FIGS. 9i and 9l, on the occurrence of a phase correction occurring on PCM clock and R0 clock, the computation is still in progress in computing block 360 and 370. In FIG. 8i it appears that the second computing block 360 is still processing one sequence of sigma-delta samples. Particularly, block 360 completes the processing of the second third of the sigma-delta pulses (window W1) and has still to process the last third of the samples before the processing of the considered sigma-delta sequence completes. Similarly, in FIG. 8l, it appears that the third computing block completes the processing of the first window W0 of one sequence and has still to compute the two following window W1 and W2 before the completion of the processing of the considered sequence occurs. Therefore, in order to preserve the exactness of the computation in blocks 360 and 370, the UP/DOWN1 and UP/DOWN2 signals on lead 391 and 393 must remain synchronized with the PCM clock which was existing just before the phase correction occurred, i.e., the internal pseudo clock generated at the output of delay 450, and this until the completion of the computation process of the sequence of sigma-delta which was in progress on the occurrence of the phase correction. When the latter computation processes completes, the corresponding computing block can be synchronized with the PCM clock. This is achieved by means of selectors 410, 411 and 412 which are controlled by the inverted output of their corresponding D-latch 400, 401 and 402. Selectors 410, 411, 412 ensure that the computation in progress when a phase correction occurs remains driven at the rhythm of the pseudo clock period existing at the output of delay circuit 450, the initiation of a new computation process being then synchronized with the PCM clock to which has been applied the phase correction. When the modem decides to apply a phase correction of one sigma-delta clock period, either positive or negative, the latter phase correction is applied to one PCM clock pulse, for instance the PCM clock pulse which coincides with a R0 clock pulse, such as illustrated in FIGS. 8a and 8d, FIGS. 9a and 9d. The phase correction appearing in the R0 clock pulse is transmitted to AND gate 430 which also receives the sigma-delta clock on lead 300 and illustrated in FIGS. 8c and 9c. The output of AND gate 430 is used as a clock signal for D-latch 400 receiving the pseudo-clock at its D-input. D-latch 400 remains ON as long as the pseudo-clock at its D input remains in phase with R0 clock. Conversely, when R0 clock generated by decode circuit 310 no longer remains in phase with the pseudo-clock existing at the output of delay circuit 450, the latch 400 switches OFF and its inverted output switches to a high level as illustrated in FIGS. 8e and 9e. The inverted output of latch 400 is used for controlling selector 410: when the inverted output of latch is set to a high level, the PCM clock existing on lead 302 is transmitted by selector 410 to the clock input of counter 311. Conversely, when the inverted output of latch 400 is set to a low level, the counter 311 is driven at the rhythm of the pseudo-clock at the output of delay 450. Whenever the contents of counter 311 reaches the value "3", i.e., the LSB and the MSB are set to a high level, NAND gate 420 disables the latter until it is reset by a R0 clock pulse appearing at its reset input. On the occurrence of one phase correction occurring on the PCM clock pulse coinciding with a pulse in R0 clock, the computation processes are still in progress in computing block 360 and 370. Since the output of AND gates 431 and 432 do not transmit any pulses, the D-latches 401 and 402 remain ON and consequently their inverted output remains at a low level. Selectors 411 and 412 transmits the internal pseudo-clock signal to the clock input of counters 312 and 313. When one among the R1 and R2 signals no longer keeps in phase with the PCM clock, the corresponding D-latch switches and controls the selector to transmit the PCM clock to the corresponding counter 312 or 313. The latter counter is therefore synchronized again with the PCM clock and this is made possible because one computation process has just completed.

FIGS. 8A to 8L particularly illustrate different timings diagrams which are involved in the phase control process with the decimation factor being equal to 4 in the case when the modem decides to generate a PCM clock pulse early. In this case, it appears in FIG. 8f that on the occurrence of the phase correction, the value stored into COEFF0 register is equal to zero only during one sigma-delta clock period while the same register should have kept the value "0" during a period of two sigma-delta clock pulse if no correction had occurred.

FIGS. 9A to 9L particularly illustrate different timing diagrams which are involved in the phase control process with the same decimation factor in the case when the PCM clock is delayed of one sigma-delta clock pulse. It also appears in this case and particularly in FIG. 9f that on the occurrence of the negative phase correction, the value stored into COEFF0 register 320 is equal to zero during a period of three sigma-delta clock period.

It should be noticed that the phase correction must not exceed one sigma-delta clock pulse since the computation process can not be shifted more than one step in both cases (advance or delay). Moreover, when a PCM phase correction occurs, the PCM clock must remain unchanged that is to say that no further correction can be admitted for a periods of 6 PCM clock period. This is required in order to let the internal pseudo clock be synchronized again with the PCM clock without applying a new correction. Such limitations are negligible because generally speaking the phase control mechanism has to be limited to low steps in order to maintain a high level of signal/noise ratio.

The decimation process can be easily preset and adjusted to predetermined parameters, i.e., the over-sampling rate and the decimation factor can be easily adjusted in a wide range in order to reach the necessary resolution for the PCM signal. It should be noticed that the filtering and decimation process operates whatever the value of the decimation factor is. This is simply achieved by using registers, adder, multiplexing circuits and accumulators having the appropriate size with respect to the higher value of the decimation factor which is desired. For instance, if the higher decimation factor which is desired is wqual to N, the registers, adders, multiplexing circuits and accumulators should respectively be able to control $N^3$ values. The number of bits is chosen accordingly. The set of computing blocks 350, 360 and 370 only requires the provision of the oversampling clock on lead 300, the train of sigma-delta pulses on lead 301 and the PCM clock on lead 302 which accuratelyindicates the instants when the PCM word resulting from the decimation process has to be delivered. The filtering an ddecimation device according to the present invention is particularly suited for a wide variety of different applications. Moreover, the adjustment of the decimation factor can be easily achieved only by adjusting the clocks which are entered into the coder.

We claim:

1. A decimation filter for converting an input train of sigma-delta pulses that includes a sigma-delta clock (fs) in synchronism with the sigma-delta clock into a train of Pulse Code Modulation (PCM) samples that include a PCM clock in accordance with the formula $$H(f) = \left( \frac{\sin\left(\frac{N\pi f}{fs}\right)}{N \sin\left(\frac{\pi f}{fs}\right)} \right)^p$$

wherein N is the decimation factor, f the frequency and p an integer, said filter comprising means for computing on PCM sample from a sequence of L sigma-delta samples in synchronism with the PCM clock, characterized in that it further includes:

means for determining whether a phase correction has to be introduced in said PCM in order to lock the generation of the PCM samples on the sigma-delta clock extracted from the train of sigma-delta pulses, and means responsive to said determination for shifting the computation process of said sequence by at least one sigma-delta clock pulse in order to provide phase control in the generation of the train of PCM samples.

2. The decimation filter according to claim 1 characterized in the p is equal to 3 and that said decimation filter includes at least one computing means for computing one PCM sample from the sequence of $3 \times N$ input samples in accordance with the formula $$\sum_{n=0}^{3N-1} C_n S_{i+n}$$

where Cn is the coefficient of the decimation filter corresponding to a determined decimation factor N, and that said filter further includes:

means for generating a sequence C(n) of coefficients of the decimation filter corresponding to determined decimation factors N, multiplying means for multiplying each coefficient Cn of said sequence C(n) by a sigma-delta input sample S(i+n), means for detecting the occurrence of the coefficient $C(3 \times N - 1)$ which is equal to zero, and means responsive to the detection of said coefficient $C(3 \times N - 1)$ for shifting by one sigma-delta clock pulse the initiation of the computing process of the next PCM sample in order to provide phase control in the generation of the PCM samples.

3. The decimation filter according to claim 2 characterized in that said filter includes three computing means receiving said sigma-delta clock, each of said computing means computing one PCM sample from a sequence of $3 \times N$ consecutive input sigma-delta pulses, each of said computing means including counting means having a reset lead and control lead for performing either an incrementation by one or a decrementation by two according to the state of said control lead, a first register for storing the value of the coefficient Cn to be multiplied by a corresponding sigma-delta sample S(i+n), adding means active every sigma-delta clock period for adding the contents of said counting means with the contents of said first register in order to compute the following coefficient Cn to be loaded into said first register, and means for respectively generating control and reset signals for said counting means in order to provide in said computing means the generation of the sequence of coefficients C(n) corresponding to said determined decimation factors N.

4. The decimnation filter according to claim 3 characterized in that said generating means includes:

means responsive to said determinatin for shifting by one sigma-delta clock pulse the generation of one PCM pulse thereby transmitting phase correction to said PCM clock, means for resetting the counting means included into the computing means which has just completed the computation of one PCM sample on the occurrence of said phase correction, and means for delaying the synchronization of said control signal by the two computing means which are still in progress until the full completion of the corresponding PCM sample calculation.

5. The decimation filter according to claim 4 characterized in that each of said three computing means further includes:

multiplying means connected to said first register and receiving said train of sigma-delta pulses for computing at every period of the sigma-delta clock (fs) the product $C_n \times S(i+n)$, and a second register continuously incremented by the result of said adding means.

6. The decimation filter according to claim 5 characterized in that in each of said three computing means, said adding means is also used for computing the new coefficient C(n+1) stored into said first register and for incrementing said second register.

7. The decimation filter according to claim 6 characterized in that each of said three computing means further includes:

multiplexing means having a first input bus connected to an output bus of said second register and a second input bus connected to the output of said counting means, said
multiplexing means being controlled by said sigma-delta clock, XOR gating means having one input connected to the output of an AND gate receiving the input train of sigma-delta pulses and also the sigma-delta clock, said XOR gating means having a second input bus connected to an output bus of said first register, and said adding means having a first input bus connected to the output of said multiplexing means and a second input bus connected to the output of said XOR gating means, the output of said adding means being connected to the input of said first and second registers, whereby said adding means performs the computation Cn+DELTA(i) during one half of said sigma-delta clock period and the update of said second register during the second half of said sigma-delta clock period.

* * * * *